(12) United States Patent
Salinas et al.

(10) Patent No.: US 10,481,192 B1
(45) Date of Patent: Nov. 19, 2019

(54) MULTIPLE-PIN-INJECTION FOR LIGHTNING TEST

(71) Applicant: BAE Systems Controls Inc., Endicott, NY (US)

(72) Inventors: Juan C. Salinas, Johnson City, NY (US); Michael D'Angelo, Endwell, NY (US); Keith D. Rose, Binghamton, NY (US)

(73) Assignee: BAE Systems Controls Inc., Endicott, NY (US)

( * ) Notice: Subject to any disclaimer, the term of this patent is extended or adjusted under 35 U.S.C. 154(b) by 259 days.

(21) Appl. No.: 15/383,529

(22) Filed: Dec. 19, 2016

(51) Int. Cl.
*G01R 31/02* (2006.01)
*G01R 31/00* (2006.01)

(52) U.S. Cl.
CPC ............ *G01R 31/02* (2013.01); *G01R 31/008* (2013.01)

(58) Field of Classification Search
CPC .............................. G01R 31/02; G01R 31/008
USPC .......................................... 324/511, 500, 510
See application file for complete search history.

(56) References Cited

U.S. PATENT DOCUMENTS

| | | | | |
|---|---|---|---|---|
| 2004/0242989 A1* | 12/2004 | Zhu | ...................... | A61B 5/0536 600/407 |
| 2005/0050393 A1* | 3/2005 | Chakraborty | .. | G01R 31/318541 714/30 |
| 2009/0251928 A1* | 10/2009 | Zheng | ................. | H02M 3/3384 363/20 |
| 2010/0303321 A1* | 12/2010 | McEwan | .............. | A61B 5/0536 382/131 |
| 2012/0230181 A1* | 9/2012 | Dame | ............... | H04L 12/40026 370/217 |
| 2015/0130486 A1* | 5/2015 | Kleindienst | .............. | H01R 4/72 324/750.26 |

OTHER PUBLICATIONS

RTCA Incorporated, "Environmental Conditions and Test Procedures for Airborne Equipment", RTCA DO-160G Edition, Prepared by SC-135, Dec. 8, 2010, Portions of Section 22, pp. 8-9 and User's Guide, Appendix 22, pp. A11-A12.

* cited by examiner

*Primary Examiner* — Giovanni Astacio-Oquendo
(74) *Attorney, Agent, or Firm* — Scully Scott Murphy & Presser PC; Scott J. Asmus

(57) ABSTRACT

A system for testing lightning pin injection Tests (indirect lightning effects) simultaneously on multiple pins of an equipment under test (EUT). A plurality of impedance-balancing elements which receive the source signal and generate multiple test input signals. Respective impedance-balancing elements are configured such that each of the test input signals meets test signal requirements defined in a test scenario. The multiple test input signals are output through the impedance-balancing elements, which serve to provide a balanced current at each individual corresponding pins of the EUT under test, when the test on the EUT begins.

20 Claims, 6 Drawing Sheets

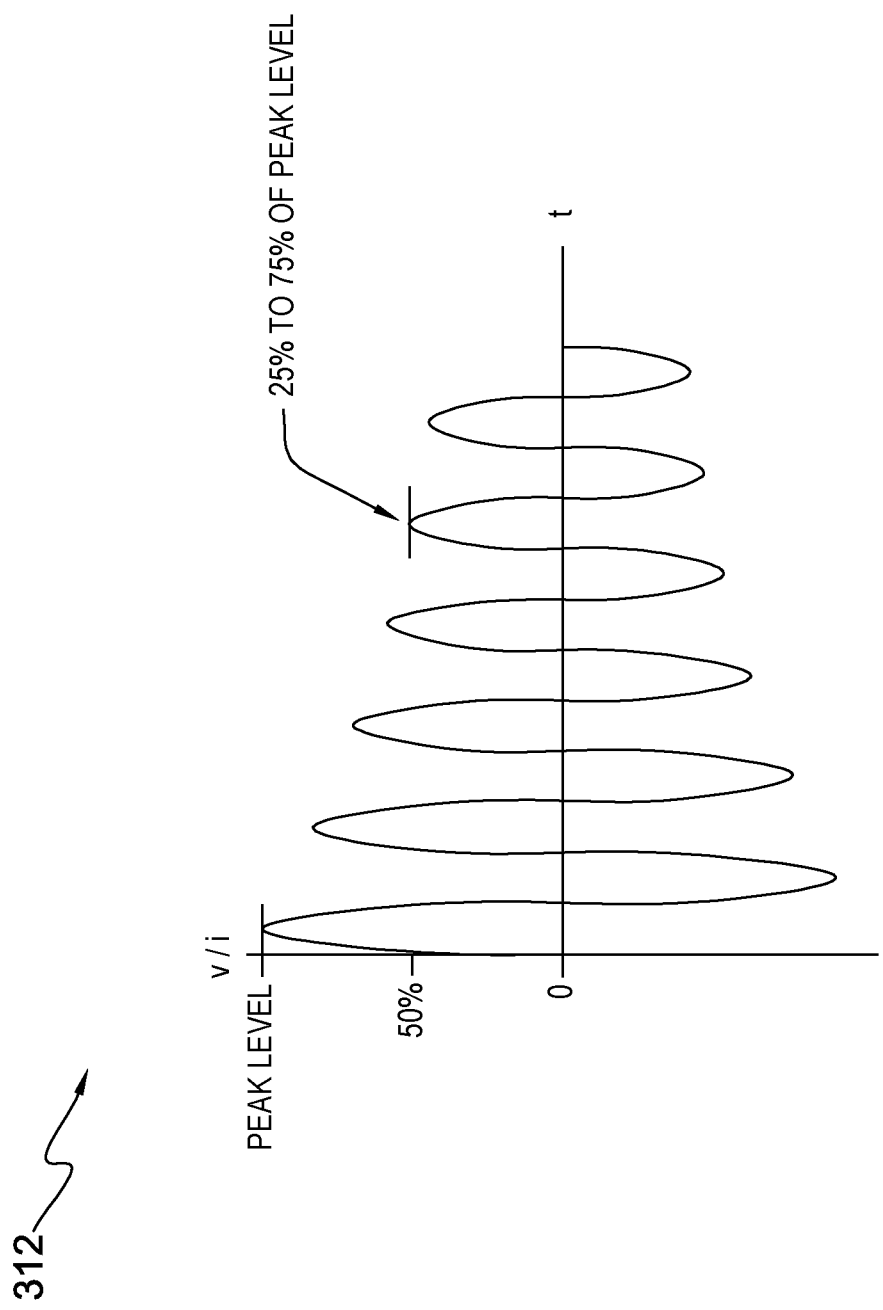

MULTIPLE-PIN-INJECTION FOR LIGHTNING TEST

FIELD

The present disclosure relates to a system or method for performing a lightning test on equipment installed in an aircraft or other vehicle.

BACKGROUND

Lightning presents a frequent and inevitable risk to commercial and military aircraft as well as other vehicles and equipments. Electronic or electrical equipment in an aircraft must be tested to verify whether the equipment can handle the effects of a lightning surge. The equipment (hereinafter, referred to as "equipment under test (EUT)") in the aircraft may be analyzed to classify its failure condition and to assign the appropriate certification level. Once lightning certification levels are determined for the EUTs, then the appropriate test levels may be assigned.

Various test standards have been developed by agencies. As a non-limiting example, the radio technical commission for aeronautics (RTCA) has established commercial test standards such as RTCA/DO-160 that is used in the military and aerospace industries. In particular, the RTCA/DO-160 verifies whether an EUT can operate as specified during and/or after various lightning induced test transient signals are injected into connector pins, interconnecting cables, and power leads of the EUT, using pin injection and/or cable bundle tests. The pin injection test is normally used to show damage tolerance of the EUT, while the cable bundle tests are used to show upset tolerance thereof.

For the capability of the EUT to withstand lightning transients to be verified, the test transient signals being injected into the EUT must be generated to represent actual induced effects of lightning. Thus, the test standards define specific waveforms and levels of the test transient signals depending on test levels and/or purposes.

Existing lightning tests on the EUT in accordance with the test standards (e.g., RTCA/DO-160) have been performed based on a single pin injection method in which each individual pin of the EUT is tested one at a time, which results in extensive test time and cost. The single pin test is also not reflective of an actual lightning strike that is not constrained to single pin operation. Although some test standards (e.g., RTCA/DO-160) describe a multiple pin injection test, it may be applicable only for loads with relatively high impedances or require using several synchronized signal generators which is considered to be difficult, so as to provide transients signals to the multiple test pins of the EUT simultaneously.

Thus, there is a need of a novel test method or system for testing an EUT, which reduces the test time and therefore reduces cost.

SUMMARY

In an aspect of the present disclosure, a system for performing a lightning multiple pin injection test on an equipment under test (EUT) is provided. The system includes a signal generator and a plurality of impedance-balancing elements. The signal generator is configured to generate a source signal. The impedance-balancing elements are configured to receive the source signal and generate test input signals based on the source signal. Impedances of the impedance-balancing elements are independent of load impedance characteristics of the EUT. Each of the impedance-balancing elements has first and second ends. The respective first ends of the impedance-balancing elements are commonly connected to an output node of the signal generator. The test input signals are output through the respective second ends of the impedance-balancing elements and are injected to corresponding pins of the EUT, respectively, when the test on the EUT begins. Respective impedances of the impedance-balancing elements are configured such that each of the test input signals meets test signal requirements defined in a test scenario.

In another aspect of the present disclosure, a method for performing test on an equipment under test (EUT) is provided. The method includes determining a test scenario, determining test signal requirements based on the test scenario, determining a source impedance of a signal generator, providing a plurality of impedance-balancing elements at positions between the signal generator and the EUT, generating the test input signals using the impedance-balancing elements, and testing the EUT by injecting the test input signals to corresponding pins of the EUT, respectively. Providing the impedance-balancing elements further includes commonly connecting respective first ends of the impedance-balancing elements to an output node of a signal generator and connecting respective second ends of the impedance-balancing elements to the corresponding pins, respectively when testing the EUT begins. Impedances of the impedance-balancing elements are independent of load impedance characteristics of the EUT. Respective impedances of the impedance-balancing elements are configured such that each of the test input signals meets the test signal requirements determined based on the test scenario.

In still another aspect, a computer program product stored in a computer readable storage medium having computer readable program instructions is provided. The computer readable program instructions are executable by at least one processor to cause the at least one processor to perform a method for operating a test system of testing an equipment under test (EUT). The test system comprises a signal generator generating a source signal and a plurality of impedance-balancing elements connected in parallel between the signal generator and the EUT. The method comprises determining a test scenario, determining test signal requirements based on the test scenario, determining a source impedance of the signal generator, determining impedances of the impedance-balancing elements, and adjusting impedances of the impedance-balancing elements based on the determined impedances. The computer readable program instructions further causes the at least one processor to configure to adjust the impedances of the impedance-balancing elements such that respective test input signals output through the impedance-balancing elements meet the test signal requirements determined based on the test scenario. Impedances of the impedance-balancing elements are independent of load impedance characteristics of the EUT.

BRIEF DESCRIPTION OF THE DRAWINGS

FIG. 3 depicts an example test input signal to be injected to pins of an EUT according to an exemplary embodiment;

DETAILED DESCRIPTION OF THE EMBODIMENTS

Embodiments of the present disclosure will now be described in detail on the basis of the drawings. However, the following embodiments do not restrict the invention claimed in the claims. Moreover, all combinations of features described in the embodiments are not necessarily mandatory for the architecture of the present system and methods Like numbers are assigned to like elements throughout the description of the embodiments of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this standard, specify the presence of stated features, integers, steps, operations, elements, and/or components, but do not preclude the presence or addition of one or more other features, integers, steps, operations, elements, components, and/or groups thereof.

A test method or system according to the present disclosure allows providing or optimizing individually test input signals in accordance with test scenarios such as defined in test standards (e.g., RTCA/DO-160) to multiple pins of an EUT. In the test method or system, multiple impedance-balancing elements are used at positions between a lightning transient signal generator and the EUT regardless of load characteristics within the EUT with no negative effect to the overall circuitry of the test system. For example, impedances of the impedance-balancing elements are independent of load impedance characteristics of the EUT. This is achieved by relocating a source impedance of the signal generator to each impedance-balancing element output which ultimately results in a constant total generator impedance defined by a combination of the source impedance of the signal generator and an impedance of each impedance-balancing element, and configurations thereof are optimized to provide the test input signals in accordance with the test scenarios, thereby distributing current among test pins of the EUT with a high degree of confidence and limiting over-current flowing into each test pin to prevent an over-test condition. Thus, the present test method allows testing multiple pins of the EUT in a simultaneous and/or synchronized manner. Impedances of the multiple impedance-balancing elements are computed before they are inserted into the test system. In some embodiments, it may be verified by a calibration whether test input signal is compliant to the given test scenarios generated and injected to the EUT.

Figure 1:
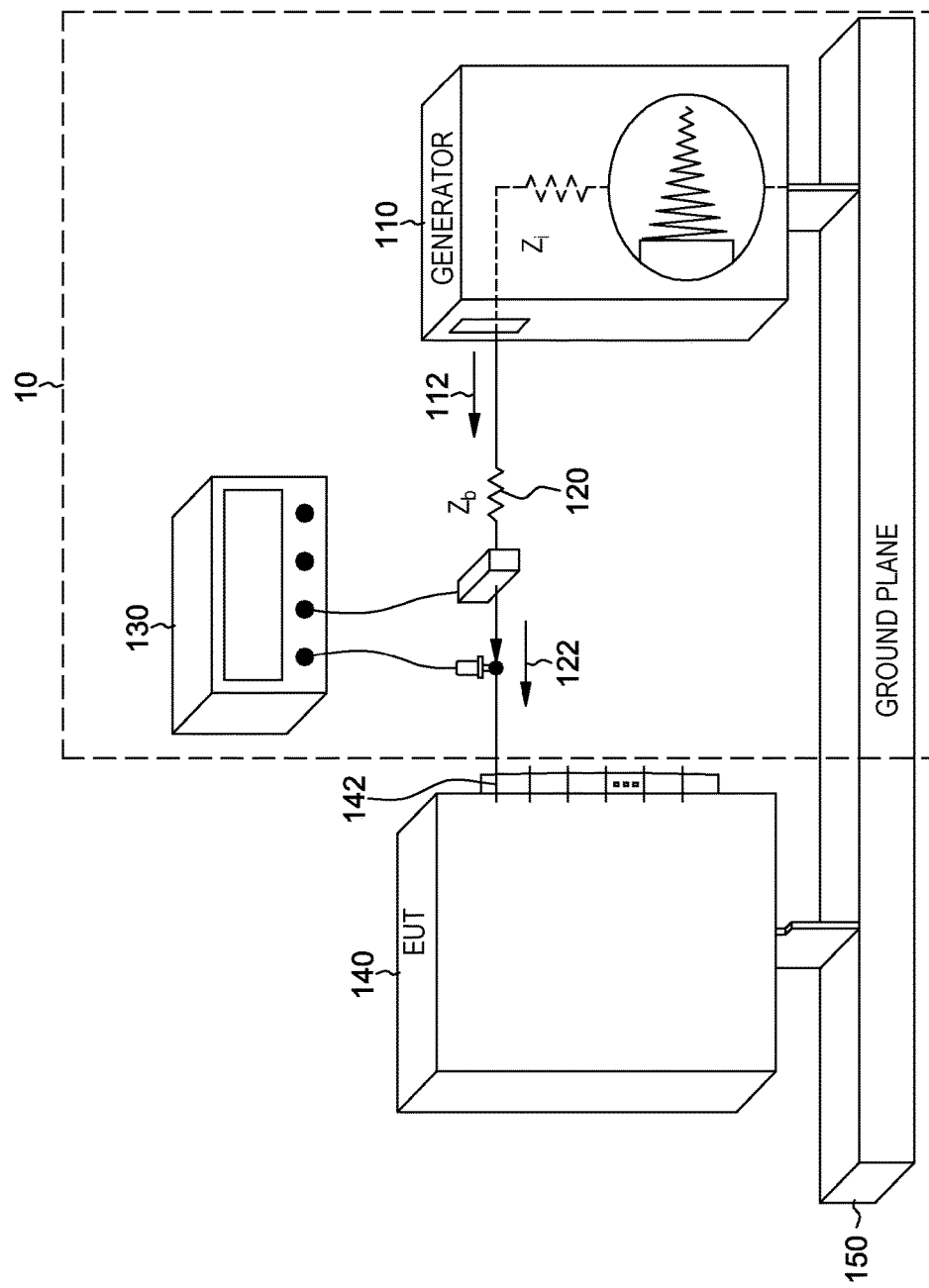
FIG. 1 depicts a diagram of an existing single pin injection test system for an EUT.

FIG. 1 depicts a conventional diagram of a single pin injection test system 10 for an equipment under test (EUT).

Referring to the example depicted in FIG. 1, the test system 10 may include a signal generator (SG) 110, an impedance-balancing element 120, and an oscilloscope 130. The EUT 140, as described herein, is equipment that was going to be installed in applications such as an aircraft. The EUT is typically subject to be tested or certified in accordance with test scenarios defined in test standards (e.g., RTCA/DO-160). The SG 110 and the EUT 140 are typically connected to a ground plane 150. The SG 110 in one example generates an electrical transient signal 112 which is intended to represent the induced effects of lightning. The transient signal 112 is coupled to one of test pins 142 of the EUT 140 via the impedance-balancing element 120. The impedance-balancing element 120 in this example functions to adapt the transient signal 112 into waveforms and levels of a test input signal 122. As shown in FIG. 1, since each individual pin of the EUT 140 is tested one at a time using the test input signal 122 provided by the impedance-balancing element 120, test time and cost will be increased accordingly.

Figure 2A:
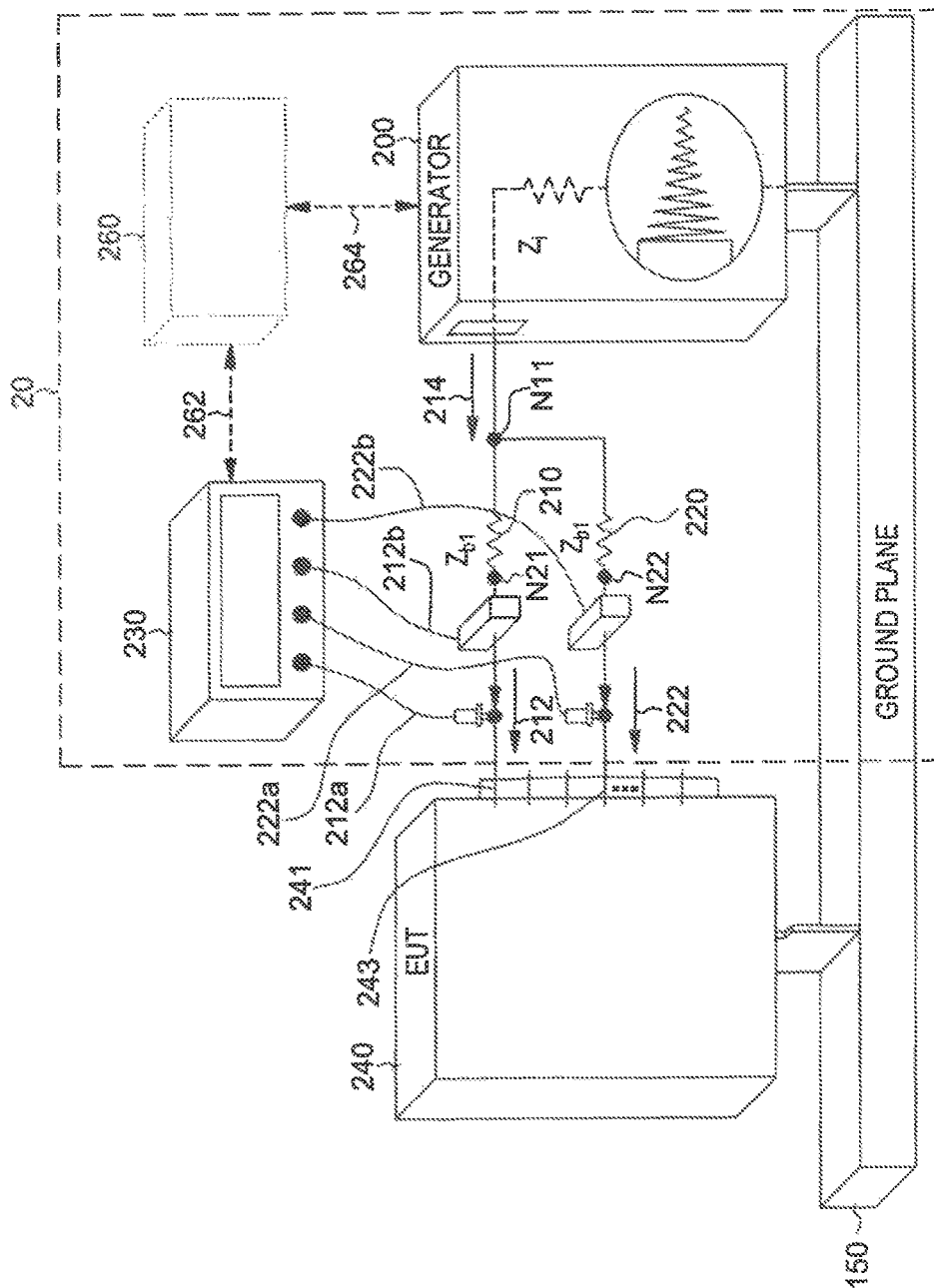
FIG. 2A depicts a diagram of an example multiple-pin injection test system for testing on an EUT, according to an exemplary embodiment.

FIG. 2A depicts a diagram of an example multiple-pin injection test system 20 for testing on the EUT according to an exemplary embodiment of the present system. The system 20 is intended for testing equipment that was installed or going to be installed in applications such as an aircraft (e.g.: airplane, drone, blimp, rocket, space craft, and other aerospace vehicles), ground vehicle (e.g.: car, bus, military vehicle, train), or fixed structure such as a building or cell tower.

Referring to the example depicted in FIG. 2A, the test system 20 includes a signal generator 200, multiple impedance-balancing elements 210 and 220, and an oscilloscope 230. The test system 20 in one embodiment includes more than one impedance-balancing element 210 and 220 between the SG 200 and the EUT 240 along with the control and processing allows testing more than one test pin of the EUT 240, thus reducing a test time and cost/schedule. It is illustrated in FIG. 2A that the number of the impedance-balancing elements 210 and 220 is two. However, exemplary embodiments of the present system are not limited thereto; for example, the number of impedance-balancing elements can be N (N is an integer greater than one), thus allowing testing N pins of the EUT 240 simultaneously.

In some embodiments, the test system 20 includes a control device 260 configured to control operations of the SG 200 and the oscilloscope 230 and/or collect data generated therefrom through signals 262 and 264, respectively. Further, although not shown in figure, in some embodiments, at least one of the multiple impedance-balancing elements 210 and 220 is implemented using a variable impedance element, so that a respective impedance of at least one of the multiple impedance-balancing elements 210 and 220 is dynamically controlled by the control device 260. In some embodiments, the control device 260 is implemented using a computing system (e.g., a computing system 5000 of FIG. 5) including at least one processor.

The SG 200 generates an electrical transient signal 214 which is intended to represent the induced effects of lightning, and in particular lightning striking an aircraft, vehicle or fixed structure. The transient signal 214 is coupled to more than one test pin of the EUT 240 via the multiple impedance-balancing elements 210 and 220. As depicted in FIG. 2A, the multiple impedance-balancing elements 210 and 220 are connected in parallel with each other. For example, each of the multiple impedance-balancing elements 210 and 220 have a first end and a second end, the first end of the impedance-balancing element 210 and the first end of the impedance-balancing element 220 are commonly connected to a node N11 which corresponds to an output node of the SG 200. In addition, the respective second ends of the multiple impedance-balancing elements 210 and 220 are connected to corresponding test pins 241 and 243 of the EUT 240, respectively when the test on the EUT 240 begins.

The multiple impedance-balancing elements 210 and 220 function to adapt the transient signal 214 of the SG 200 into waveforms and levels of the test input signals 212 and 222. The multiple impedance-balancing elements 210 and 220 receive the transient signal 214 through the node N11 from the SG 200 and output first and second test input signals 212 and 222 through nodes N21 and N22, respectively.

Each of the test input signals 212 and 222 will be injected to a corresponding one of the test pins 241 and 243 of the EUT 240 for the lightning test. Thus, as depicted in FIG. 2A, the nodes N21 and N22 which correspond to the respective second ends of the impedance-balancing elements 210 and 220 are understood as test leads which provide the test input signals 212 and 222 to the corresponding test pins 241 and 243 of the EUT 240. In some embodiments, a distance between each of the nodes N21 and N22 and a corresponding one of the multiple pins 241 and 243 of the EUT 240 is shorter than a predetermined distance, e.g., 5 mm.

Each of the test input signals 212 and 222 has voltage or current waveforms defined in a test scenario. During the test, the respective test leads at the nodes N21 and N22 are connected to the corresponding test pins 241 and 243 of the EUT 240, respectively, and thus injecting the test input signals 212 and 222 thereto. The oscilloscope 230 is used to observe the voltage and current signal waveforms at the nodes N21 and N22. Thus, in this example, for each of the nodes N21 and N22, the oscilloscope 230 has two channels to measure the voltage and current waveforms, and thus requiring four channels in total to fully measure the voltage and current signals at the nodes N21 and N22.

In some embodiments, the impedance-balancing elements 210 and 220 have the same impedance $Z_{b1}$ as each other. In this case, the respective impedance $Z_{b1}$ of each multiple impedance-balancing element 210 and 220 may be optimized to provide a corresponding one of the test input signal 212 and 222. A combined impedance of the multiple impedance-balancing elements 210 and 220 is calculated by $Z_{b1}/2$.

By way of one example, if the SG 200 generates a peak voltage level of $V_i$ and a peak current level of $I_i$ and each test input signal 212 (or 222) is required to a peak voltage level of $V_s$ and a peak current level of $I_s$, then a sum of the combined impedance $Z_{b1}/2$ and the source impedance $Z_i$ of the SG 200 is equal to $V_s/(2I_s)$, as given by Equation (1) as below.

$$\frac{Z_{b1}}{2} + Z_i = \frac{V_s}{2I_s} \qquad \text{Equation (1)}$$

Thus, the respective impedance $Z_{b1}$ of each impedance-balancing element 210 and 220 in one example is determined by Equation (2) as below.

$$Z_{b1} = \frac{V_s}{I_s} - 2Z_i \qquad \text{Equation (2)}$$

The source impedance $Z_i$ of the SG 200 may be defined by a ratio of the peak voltage level $V_i$ to the peak current level $I_i$ at the output of the SG 200. By way of example, if the peak voltage level $V_i$ and the peak current level $I_i$ of the SG 200 are 1500V and 500 A, respectively, and the peak voltage level $V_s$ and the peak current level $I_s$ of the required test input signal 212 (or 222) are 1500V and 60 A, respectively, then the source impedance $Z_i$ and $V_s/I_s$ are determined as 3Ω and 25Ω, respectively. Thus, the respective impedance $Z_{b1}$ of each impedance-balancing element 210 (or 220) is 19Ω using Equation (2). Stated differently, if the peak voltage level $V_i$ and the peak current level $I_i$ of the SG 200 are 1500V and 500 A, respectively, and the impedance $Z_{b1}$ of each impedance-balancing element 210 (or 220) is 19Ω, then each of the respective test input signals 212 and 222 measured at the nodes N21 and N22 using the oscilloscope 230 may have a peak voltage level $V_s$ of 1500V and a peak current level $I_s$ of 60A.

The above equations are generalized to the case where the number of multiple impedance-balancing elements are N which allow testing N pins of the EUT 240, simultaneously. If all of the N impedance-balancing elements have the same impedance, denoted as $Z_{b2}$, a combined impedance of the N impedance-balancing elements is calculated by $Z_{b2}/N$. Equation (1) is modified, as given by Equation (3) as below.

$$\frac{Z_{b2}}{N} + Z_i = \frac{V_s}{N \cdot I_s} \qquad \text{Equation (3)}$$

Thus, the impedance $Z_{b2}$ of each of the N impedance-balancing elements is given by Equation (4) as below.

$$Z_{b2} = \frac{V_s}{I_s} - N \cdot Z_i \qquad \text{Equation (4)}$$

Here, "·" represents a multiplication operation. The source impedance $Z_i$ of the SG 200 may be defined by a ratio of the peak voltage level $V_i$ to the peak current level $I_i$ at the output of the SG 200. By way of example, if the peak voltage level $V_i$ and the peak current level of the SG 200 are 1500V and 500 A, respectively, and the peak voltage level $V_s$, and the peak current level $I_s$ of the required test input signal 212 (or 222) are 1500V and 60 A, respectively, then the source impedance $Z_i$ and $V_s/I_s$ are determined as 3Ω and 25Ω, respectively. Thus, the impedance $Z_{b2}$ of each of the N impedance-balancing elements is given by (25−3N) Ω using Equation (4).

Hereinafter, the description on the test system 20 will be made based on assumption that the number of multiple impedance-balancing elements is two (i.e., N=2) for the sake of simplicity, but is not intended to be exhaustive or limited to the present invention.

Figure 2B:
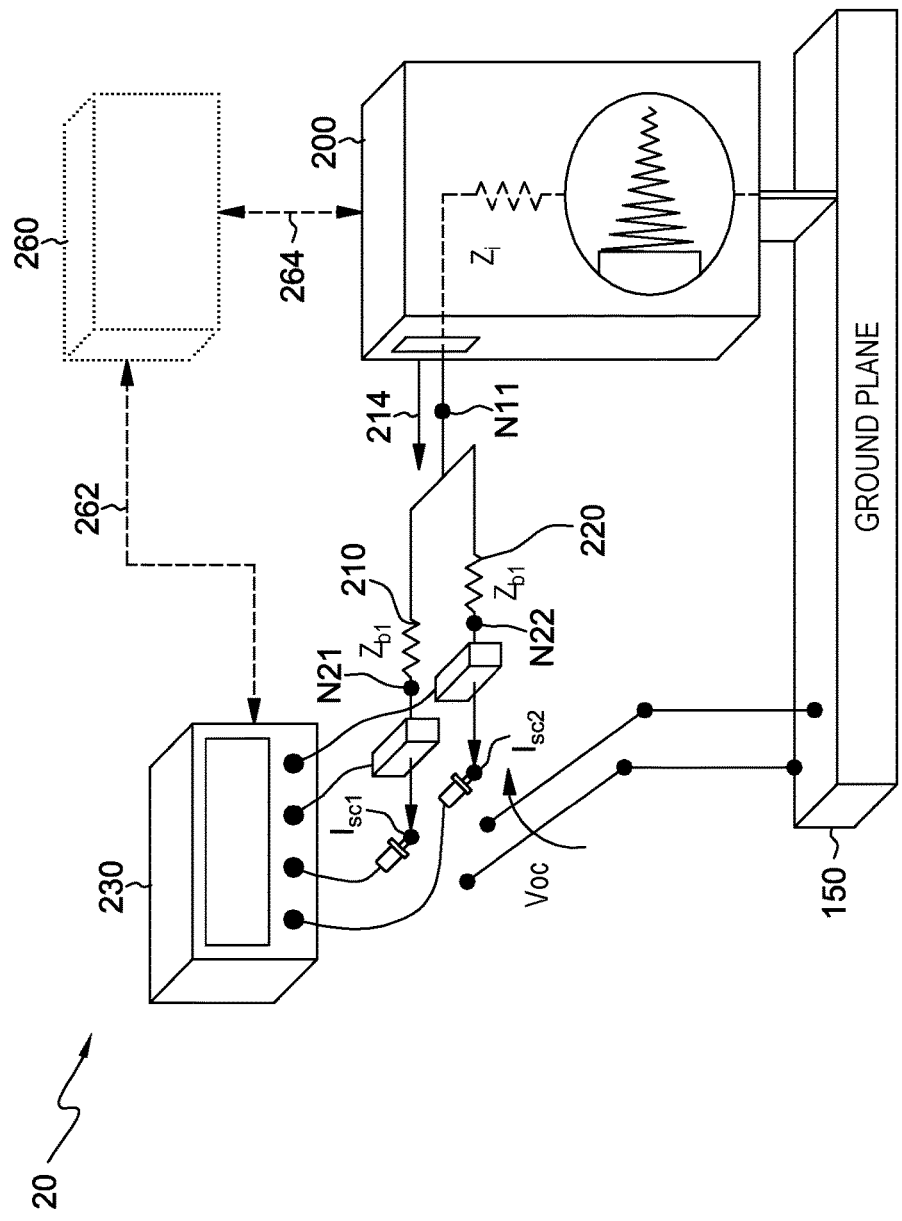
FIG. 2B depicts an example calibration setup for the test system of FIG. 2A when test leads at the nodes N21 and N22 are not connected to corresponding pins of an EUT, according to an exemplary embodiment.

In one test scenario, it may be required to perform a calibration before the test on the EUT 240 begins. For the sake of simplicity, if it is assumed that the number of multiple impedance-balancing elements is two (i.e., N=2), during the calibration, it may be verified that respective test input signals 212 and 222 at the nodes N21 and N22 conform to requirements defined in the test scenario. FIG. 2B depicts an example calibration setup for the test system 20 of FIG. 2A when the test leads at the nodes N21 and N22 are not connected to the corresponding test pins 241 and 243 of the EUT 240.

For example, the test input signal 212 may be characterized by an open-circuit voltage $V_{oc}$ defined between the node N21 and the ground plane 150 (when the connections between the nodes N21 and N22 and the ground plane 150 are open-circuited) and a short-circuit current $I_{sc1}$ flowing through the node N21 (when the connections between the both nodes N21 and N22 and the ground plane 150 are short-circuited). By way of example, as depicted in FIG. 2B, steps for measuring the open-circuit voltage $V_{oc}$ at the node N21 include, but are not limited: connecting (e.g., open-circuit) the both nodes N21 and N22 and the ground plane 150; turning on the SG 200 and gradually increasing the output voltage level of the SG 200 until a voltage waveform (e.g., 212a of FIG. 2A) at the node N21 conforms to the test input signal requirements (e.g., peak voltage level $V_s$) defined in the test scenario; and recording a setting of the SG 200. In addition, steps for measuring the short-circuit current $I_{sc1}$ at the node N21 include, but are not limited: disconnecting (e.g., short-circuit) the both nodes N21 and N22 and the ground plane 150; increasing the output current level of the SG 200 until a current waveform (e.g., 212b of FIG. 2A) at the node N21 conforms to the test input signal requirements (e.g., peak current level $I_s$) defined in the test scenario; and recording a setting of the SG 200.

In some aspects, if the impedance $Z_{b1}$ is correctly optimized, the recorded setting of the SG 200 when the open-circuit voltage $V_{oc}$ is calibrated at the node N21 may substantially be the same as the recorded setting of the SG 200 when the short-circuit current $I_{sc1}$ is calibrated at the node N21.

At the node N21, the ratio of the open-circuit voltage $V_{oc}$ to the short-circuit current $I_{sc1}$ may be equal to the impedance $Z_{b1}$ of the impedance-balancing element 210. Stated differently, if the impedance $Z_{b1}$ is correctly optimized, the open-circuit voltage $V_{oc}$ and the short-circuit current $I_{sc1}$ observed at the node N21 will meet the test input signal requirements defined in the test scenario.

In addition, for example, the test input signal 220 may be characterized by an open-circuit voltage $V_{oc}$ defined between the node N22 and the ground plane 150 (when connections between the ground plane 150 and the both nodes N21 and N22 are open-circuited) and a short-circuit current $I_{sc2}$ flowing through the node N22 (when the ground plane 150 and the both nodes N21 and N22 are short-circuited). By way of example, as depicted in FIG. 2B, steps for measuring the open-circuit voltage $V_{oc}$ at the node N22 include, but are not limited: connecting (e.g., open-circuit) the both nodes N21 and N22 and the ground plane 150; turning on the SG 200 and gradually increasing the output voltage level of the SG 200 until a voltage waveform (e.g., 222a of FIG. 2A) at the node N22 conforms to the test input signal requirements (e.g., peak voltage level $V_s$) defined in the test scenario; and recording a setting of the SG 200. In addition, steps for measuring the short-circuit current $I_{sc2}$ at the node N22 include, but are not limited to: disconnecting (e.g., short-circuit) the both nodes N21 and N22 and the ground plane 150; increasing the output current level of the SG 200 until a current waveform (e.g., 222b of FIG. 2A) at the node N22 conforms to the test input signal requirements (e.g., peak current level $I_s$) defined in the test scenario; and recording a setting of the SG 200.

In some aspects, if the impedance $Z_{b1}$ is correctly optimized, the recorded setting of the SG 200 when the open-circuit voltage $V_{oc}$ is calibrated at the node N22 may substantially be the same as the recorded setting of the SG 200 when the short-circuit current $I_{sc2}$ is calibrated at the node N22.

At the node N22, the ratio of the open-circuit voltage $V_{oc}$ to the short-circuit current $I_{sc2}$ may be equal to the impedance $Z_{b1}$ of the impedance-balancing element 220. Stated differently, if the impedance $Z_{b1}$ is correctly optimized, the open-circuit voltage $V_{oc}$ and the short-circuit current $I_{sc2}$ observed at the node N22 will meet the test input signal requirements defined in the test scenario.

The calibration steps described above are intended to be illustrative only and embodiments of the present system are not limited thereto. In some embodiments, the calibration steps are omitted to reduce a test time and cost.

Referring back to the example FIG. 2A, in some test scenarios, the EUT 240 is tested by injecting the test input signals 212 and 222 at the nodes N21 and N22 to the corresponding test pins 241 and 243 to assess a dielectric withstand voltage or damage tolerance of equipment interface circuits. In some aspects, the EUT 240 is powered on if it includes an active element. Next, M individual transient signals (M is an integer greater than one) may be applied to the selected pins 241 and 243 and the voltage and current waveforms may be observed at the respective nodes N21 and N22 using the oscilloscope 230 to see if unexpected waveform changes occur. For example, if the voltage or current waveforms do not change or changes thereof are within a predetermined range, responsive to injections of all the M transient signals into the test pins 241 and 243, the test system 20 may give a verdict that the EUT 240 has passed the above test scenario. On the other hand, if the voltage or current waveform changes beyond the predetermined range, responsive to injections of at least one or a predetermined number of the M transient signals into the test pins 241 and 243, the test system 20 may give a verdict that the EUT 240 has failed the test scenario.

In some embodiments, the test system 20 of FIG. 2A may be a setup designed for a direct pin injection test where the test input signals 212 and 222 are directly coupled to the test pins 241 and 243 of the EUT 240. For example, the direct pin injection test may be considered a destructive test as the test input signals are injected directly into the EUT 240. Thus, for example, the test pins 241 and 243 of the EUT 240 may have a relatively low impedance with the ground plane 150. In some embodiments, a respective interface between the ground plane 150 and each of test pins (e.g., 241 and 243 of FIG. 2A) which are subject to the multiple-pin injection test according to the present invention may have an impedance equal to or lower than a predetermined value, e.g., 100Ω

In some embodiments, although not shown in figures, an injection transformer is provided at a position between the SG 200 and the multiple impedance-balancing elements 210 and 220 in the test system 20 of FIG. 2A, so that power (e.g., a voltage, current) of a test input signal (e.g., 212 (or 222)) becomes adequately high enough to meet requirements defined in some test scenarios such as a core injection test (also known as a "cable induction" test). The output transient signal of the SG 200 is input to the primary winding of the transformer and coupled to the secondary winding thereof. The multiple impedance-balancing elements 210 and 220 are connected between the secondary winding of the transformer and respective cables (or interconnect wires) under test of the EUT.

In some embodiments, referring to FIG. 2A, each of the multiple impedance-balancing elements 210 and 220 is implemented as a resistor or a pair of resistor and capacitor connected in parallel.

FIG. 3 depicts example test input signals to be injected to test pins of an EUT according to an exemplary embodiment of the present system.

The test input signal 312 shown in FIG. 3 corresponds to a voltage or current waveform defined as some test standards (e.g., RTCA/DO-160). The waveforms may be traced along with either a damped sine or cosine function. For example, the test input signal 312 may be characterized by parameters such as: a peak voltage (or current) level, a frequency, a ratio of the fifth peak level to the first peak level, etc. For example, the waveform 3 (with test level 3) defines the peak voltage and current levels as 1600V and 60 A, respectively, which are used to describe with reference to FIG. 2A. The test input signal 312 shown in FIG. 3 is intended to be illustrative only and embodiments of the present system are not limited thereto.

Figure 4:
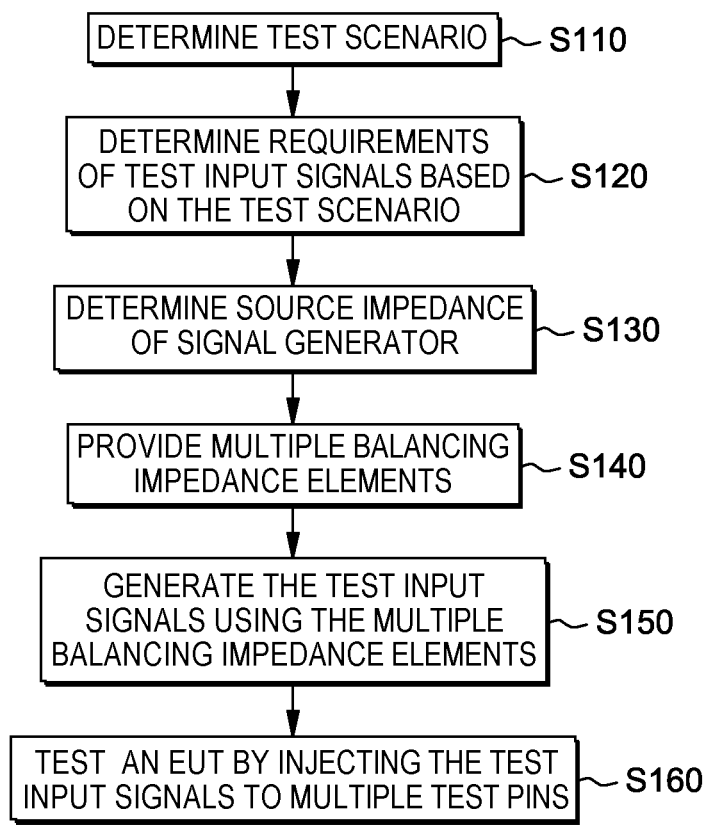
FIG. 4 is a flow chart illustrating a method for performing a lightning test on an EUT according to an exemplary embodiment.

FIG. 4 is a flow chart illustrating a method for performing a lightning test on an EUT according to an exemplary embodiment of the present invention.

Referring to FIG. 4, at step S110, a test scenario may be determined. In some embodiments, the test scenario is defined in a test standard and it is determined by a user which test scenario will be tested to the EUT. For example, a specific test scenario is selected by a user from a list of test scenarios, in this example, the selected test scenario is input by a user through an I/O interface of a computing system. In another example where a test automation is implemented to at least two test scenarios, the computing system determines a test scenario to be tested by reading program codes stored therein. The computing system may be used as a platform for performing (or controlling) the method including at least one of steps S110 to S160. Exemplary embodiments of the computing system will be described in more detail with reference to FIG. 5.

In addition, referring to FIGS. 2A and 4, the requirements of the test input signals 212 and 222 which will be injected to the corresponding pins 241 and 243 of the EUT 240 may be determined based on the test scenario (S120).

The source impedance $Z_i$ of the SG 200 may be determined (S130). In some embodiments, the source impedance $Z_i$ may be determined by measuring an open-circuit voltage and a short-circuit current at the output node N1 of the SG 200 and calculating a ratio of the peak level $V_i$ of the open-circuit voltage to the peak level $I_i$ of the short-circuit current. The open-circuit voltage may be measured at the output node N1 of the SG 200 after making an open-circuit between the output node N1 and the ground plane 150. The short-circuit current may be measured at the output node N1 of the SG 200 after making a short-circuit between the output node N1 and the ground plane 150. In other embodiments, the source impedance $Z_i$ may be provided by a data sheet provided by the SG manufacturer.

In addition, the multiple impedance-balancing elements 210 and 220 may be provided (S140). In some embodiments, the multiple impedance-balancing elements may be provided being connected in parallel with each other. For example, the respective first ends of the multiple impedance-balancing elements 210 and 220 may be commonly connected to the output node N1 of the SG 200. In addition, the respective second ends of the multiple impedance-balancing elements 210 and 220 may be connected to the corresponding test pins 241 and 243 of the EUT 240, respectively when the test on the EUT 240 begins. The multiple impedance-balancing elements 210 and 220 may function to adapt the transient signal 214 of the SG 200 into waveforms and levels meeting the test input signal requirements determined in the step S120.

In some embodiments, the providing of the multiple impedance-balancing elements 210 and 220 (S140) may include determining impedances of the multiple impedance-balancing elements 210 and 220. For example, the multiple impedance-balancing elements 210 and 220 may have the same impedance $Z_{b1}$ (or $Z_{b2}$) as each other. In this case, the respective impedance $Z_{b1}$ of each multiple impedance-balancing element 210 (or 220) may be optimized to provide a corresponding one of the test input signals 212 and 222. The respective impedance $Z_{b1}$ of each impedance-balancing element 210 (or 220) may be computed based on the source impedance $Z_i$ determined in the step S130 and the test input signal requirements determined in the step S120. For example, the respective impedance $Z_{b1}$ of each impedance-balancing element 210 (or 220) may be determined by Equation (4).

In some embodiments, at least one of the multiple impedance-balancing elements 210 and 220 is implemented using a variable impedance-balancing element, so that a respective impedance of the at least one of the multiple impedance-balancing elements 210 and 220 may be dynamically controlled by the control device 260. Thus, in some embodiments, the providing of the multiple impedance-balancing elements 210 and 220 (S140) may further include adjusting impedances (e.g., $Z_{b1}$) of the multiple impedance-balancing elements 210 and 220 based on the impedances determined in the above-mentioned step.

In addition, at step S150, the test input signals 212 and 222 may be generated and output through the respective second ends of the multiple impedance-balancing elements 210 and 220.

In addition, at step S160, the EUT 240 may be tested by injecting the test input signals 212 and 222 to the corresponding test pins 241 and 243. In some embodiments, the calibration steps described previously of the present disclosure may be performed before injecting the test input signals 212 and 222 to the corresponding test pins 241 and 243 to verify that the respective test input signals 212 and 222 conform to the test input signal requirements determined in the step S120. However, in other embodiments, the calibration steps may be omitted to reduce a test time and cost.

In addition, in some embodiments, the testing needs to determine whether the EUT 240 passes (or fail) the test scenario determined in the step S110 using the process described herein.

Figure 5:
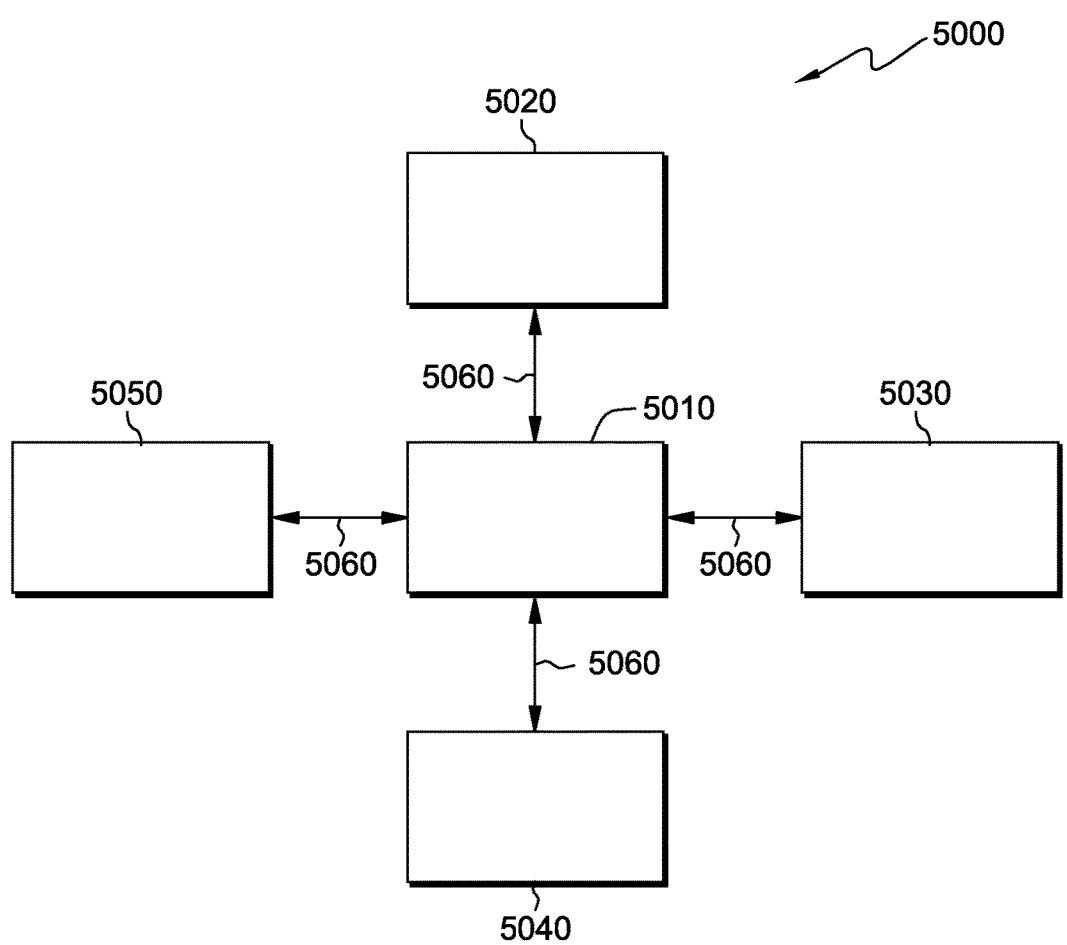
FIG. 5 is a block diagram of a computing system according to an exemplary embodiment.

FIG. 5 is a block diagram of a computing system 5000 according to an exemplary embodiment of the present system.

Referring to FIG. 5, the computing system 5000 is used as a platform for performing (or controlling) the operations or functions described hereinabove with respect to the system of FIGS. 2A and 2B and/or the method of FIG. 4.

As shown in FIG. 5, the computing system 5000 includes a processor 5010, I/O devices 5020, a memory system 5030, a display device 5040, and a network adaptor 5050.

The processor 5010 in this example drives the I/O devices 5020, the memory system 5030, the display device 5040, and the network adaptor 5050 through a bus 5060.

The computing system 5000 includes a program module (not shown) for performing (or controlling) the operations or functions described hereinabove with respect to the system of FIGS. 2A and 2B and/or the method of FIG. 4 according to exemplary embodiments. For example, the program module may include routines, programs, objects, components, logic, data structures, or the like, for performing particular tasks or implement particular abstract data types. The processor (e.g., 5010) of the computing system 5000 may execute instructions written in the program module to perform (or control) the operations or functions described hereinabove with respect to the system of FIGS. 2A and 2B and/or the method of FIG. 4. The program module may be programmed into the integrated circuits of the processor (e.g., 5010). In an exemplary embodiment, the program module may be stored in the memory system (e.g., 5030) or in a remote computer system storage media.

The computing system 5000 may include a variety of computing system readable media. Such media may be any available media that is accessible by the computer system (e.g., 5000), and it may include both volatile and non-volatile media, removable and non-removable media.

The memory system (e.g., 5030) can include computer system readable media in the form of volatile memory, such as random access memory (RAM) and/or cache memory or others. The computer system (e.g., 5000) may further include other removable/non-removable, volatile/non-volatile computer system storage media.

The computer system (e.g., 5000) can communicate with one or more devices using the network adapter (e.g., 5050). The network adapter may support wired communications based on Internet, LAN, WAN, or the like, or wireless communications based on CDMA, GSM, wideband CDMA, CDMA-2000, TDMA, LTE, wireless LAN, Bluetooth, or the like.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++ or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to a flowchart illustration and/or block diagram of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A system for performing a lightning multiple pin injection test on an equipment under test (EUT), comprising:
   a signal generator configured to generate a source signal; and
   a plurality of impedance-balancing elements configured to receive the source signal and generate test input signals based on the source signal;
   wherein impedances of the impedance-balancing elements are independent of load impedance characteristics of the EUT,
   wherein the impedance-balancing elements have first and second ends,
   wherein the respective first ends of the impedance-balancing elements are commonly connected to an output node of the signal generator,
   wherein the test input signals are output through the respective second ends of the impedance-balancing elements and are injected to corresponding pins of the EUT, respectively, when the test on the EUT begins, and
   wherein the respective impedances of the impedance-balancing elements are configured such that each of the test input signals meets test signal requirements defined in a test scenario.

2. The system of claim 1, wherein at least one of the impedance-balancing elements comprises at least one variable impedance element whose impedance varies by a control.

3. The system of claim 2, further comprising at least one processor configured to control operations of the signal generator and the impedance of the at least one variable impedance element.

4. The system of claim 1, further comprising a transformer connected between the signal generator and the impedance-balancing elements, wherein the transformer couples the source signal of the signal generator to each of the impedance-balancing elements.

5. The system of claim 1, wherein an impedance of each of the impedance-balancing elements is substantially the same.

6. The system of claim 5, wherein the impedance of each of the impedance-balancing elements is computed based on a source impedance of the signal generator and the test signal requirements defined in the test scenario.

7. The system of claim 6, wherein the source impedance of the signal generator is obtained by a ratio of a peak voltage level at the output node of the signal generator to a peak current level at the output node of the signal generator.

8. The system of claim 5, wherein the impedance of each of the impedance-balancing elements is calculated by the following equation:

$$Z_1 = \frac{V_s}{I_s} - N \cdot Z_i,$$

wherein $Z_1$ and $Z_i$ represent the impedance of each of the impedance-balancing elements and the source impedance, respectively, and $V_s$, and $I_s$ are a peak voltage level and a peak current level, respectively, of each of the test input signals, wherein N is an integer greater than one and represents a number of the impedance-balancing elements, and "·" represents a multiplication operation.

9. A method for performing a lightning multiple pin injection test on an equipment under test (EUT), comprising:
   determining a test scenario, wherein computer readable program instructions stored in a non-transitory computer-readable storage medium executable by at least one processor determines the test scenario to be tested to the EUT by the program instructions stored therein;
   determining test signal requirements based on the test scenario;
   determining a source impedance of a signal generator;
   providing a plurality of impedance-balancing elements at positions between the signal generator and the EUT;
   generating test input signals using the impedance-balancing elements; and
   testing the EUT by injecting the test input signals to corresponding pins of the EUT, respectively,
   wherein providing the impedance-balancing elements comprises:
   commonly connecting respective first ends of the impedance-balancing elements to an output node of a signal generator; and connecting respective second ends of the impedance-balancing elements to the corresponding pins, respectively when testing the EUT begins,
   wherein impedances of the impedance-balancing elements are independent of load impedance characteristics of the EUT, and
   wherein the computer readable program instructions stored in the non-transitory computer-readable storage medium executable by at least one processor are configured to adjust the impedances of the impedance-balancing elements such that respective test input signals output through the impedance-balancing elements meet the test signal requirements determined based on the test scenario.

10. The method of claim 9, wherein at least one of the impedance-balancing elements comprises at least one variable impedance element whose impedance varies by a control.

11. The method of claim 9, wherein an impedance of each of the impedance-balancing elements is substantially the same.

12. The method of claim 9, wherein generating the test input signals comprises coupling a source signal of the signal generator to each of the impedance-balancing elements using a transformer connected between the signal generator and the impedance-balancing elements.

13. The method of claim 11, wherein the impedance of each of the impedance-balancing elements is computed based on the source impedance of the signal generator and the test signal requirements.

14. The method of claim 11, wherein the impedance of each of the impedance-balancing elements is calculated by the following equation:

$$Z_1 = \frac{V_s}{I_s} - N \cdot Z_i,$$

wherein $Z_1$ and $Z_i$ represent the impedance of each of the impedance-balancing elements and the source impedance, respectively, and $V_s$ and $I_s$ are a peak voltage level and a peak current level, respectively, of each of the test input signals, wherein N is an integer greater than one and represents a number of the impedance-balancing elements, and "·" represents a multiplication operation.

15. A computer program product stored in a non-transitory computer-readable storage medium having computer readable program instructions, the computer readable program instructions executable by at least one processor to cause the at least one processor to perform a method for operating a test system of testing a lightning multiple pin injection on an equipment under test (EUT), wherein the test system comprises a signal generator generating a source signal and a plurality of impedance-balancing elements connected in parallel between the signal generator and the EUT, wherein the method comprises:
determining a test scenario;
determining test signal requirements based on the test scenario;
determining a source impedance of the signal generator;
determining impedances of the impedance-balancing elements; and
adjusting impedances of the impedance-balancing elements based on the determined impedances, wherein the computer readable program instructions further causes the at least one processor to configure to adjust the impedances of the impedance-balancing elements such that respective test input signals output through the impedance-balancing elements meet the test signal requirements determined based on the test scenario,
wherein the impedances of the impedance-balancing elements are independent of load impedance characteristics of the EUT.

16. The computer program product of claim 15, wherein the impedance-balancing elements are implemented using variable impedance elements.

17. The computer program product of claim 15, wherein an impedance of each of the impedance-balancing elements is substantially the same.

18. The computer program product of claim 15, wherein the test system further comprises a transformer connected between the signal generator and the impedance-balancing elements.

19. The computer program product of claim 17, wherein the impedance of each of the impedance-balancing elements is determined based on the source impedance of the signal generator and the test signal requirements.

20. The computer program product of claim 17, wherein the impedance of each of the impedance-balancing elements is calculated by the following equation:

$$Z_1 = \frac{V_s}{I_s} - N \cdot Z_i,$$

wherein $Z_1$ and $Z_i$ represent the impedance of each of the impedance-balancing elements and the source impedance, respectively, and $V_s$ and $I_s$ are a peak voltage level and a peak current level, respectively, of each of the test input signals, wherein N is an integer greater than one and represents a number of the impedance-balancing elements, and "·" represents a multiplication operation.

* * * * *